(12) United States Patent
Li

(10) Patent No.: US 9,535,106 B2
(45) Date of Patent: Jan. 3, 2017

(54) LEAKAGE CURRENT DETECTION DEVICE FOR APPLIANCES

(71) Applicant: Chengli Li, Suzhou (CN)

(72) Inventor: Chengli Li, Suzhou (CN)

( * ) Notice: Subject to any disclaimer, the term of this patent is extended or adjusted under 35 U.S.C. 154(b) by 0 days.

(21) Appl. No.: 15/151,801

(22) Filed: May 11, 2016

(65) Prior Publication Data

US 2016/0252557 A1 Sep. 1, 2016

Related U.S. Application Data

(63) Continuation-in-part of application No. 14/614,334, filed on Feb. 4, 2015.

(30) Foreign Application Priority Data

Apr. 20, 2016 (CN) .......................... 2016 1 0248344
Apr. 20, 2016 (CN) ...................... 2016 2 0335689 U

(51) Int. Cl.

| G01R 31/02 | (2006.01) |
|---|---|
| H02H 3/16 | (2006.01) |
| H03K 5/24 | (2006.01) |
| G01R 31/04 | (2006.01) |
| G01R 31/42 | (2006.01) |
| G01R 35/00 | (2006.01) |
| H02H 3/33 | (2006.01) |

(52) U.S. Cl.
CPC ............. *G01R 31/025* (2013.01); *G01R 31/04* (2013.01); *G01R 31/42* (2013.01); *G01R 35/00* (2013.01); *H02H 3/16* (2013.01); *H02H 3/335* (2013.01); *H03K 5/24* (2013.01)

(58) Field of Classification Search
CPC ............ H02H 3/16; H03K 5/24; G01R 31/025
USPC .......................................................... 361/42
See application file for complete search history.

(56) References Cited

U.S. PATENT DOCUMENTS

| 6,980,005 | B2 | 12/2005 | Finlay et al. | |
|---|---|---|---|---|
| 8,081,001 | B2 | 12/2011 | Hooper et al. | |
| 8,513,964 | B2* | 8/2013 | Yue ......................... | H01H 83/04 |
| | | | | 324/130 |
| 2005/0212522 | A1* | 9/2005 | Finlay ..................... | H02H 3/335 |
| | | | | 324/509 |
| 2012/0217970 | A1 | 8/2012 | Macbeth et al. | |
| 2014/0009856 | A1* | 1/2014 | Ward ....................... | H02H 3/162 |
| | | | | 361/42 |

(Continued)

*Primary Examiner* — Scott Bauer
(74) *Attorney, Agent, or Firm* — Chen Yoshimura LLP

(57) ABSTRACT

A leakage current detection device includes a self-test pulse generating unit, for generating a pulsed triggering signal when the leakage current detection device is initially energized; a self-test unit, for periodically generating simulated leakage current signals, and generating a simulated leakage current signal based on the pulsed triggering signal; and a leakage current detection unit, for detecting the simulated leakage current and actual leakage current faults. An electrical connection device incorporating the leakage current detection device is also disclosed. By providing the self-test pulse generating unit, the self-test unit can be triggered immediately after the device is initially energized to perform a self test, which prevents faults and unsafe conditions before periodic self test starts. By providing a discharge unit, the leakage current detection device is prevented form performing self test under low voltage conditions and accidental tripping can be avoided.

14 Claims, 4 Drawing Sheets

(56) References Cited

U.S. PATENT DOCUMENTS

| 2014/0268436 | A1 | 9/2014 | Du et al. |
| 2015/0062760 | A1* | 3/2015 | Simonin ................ H02H 3/335 |
| | | | 361/42 |
| 2015/0309103 | A1 | 10/2015 | Ostrovsky et al. |

* cited by examiner

LEAKAGE CURRENT DETECTION DEVICE FOR APPLIANCES

BACKGROUND OF THE INVENTION

Field of the Invention

This invention relates to the field of electrical appliance and related circuitry, and in particular, it relates to a leakage current detection device and electrical connection device incorporating the leakage current detection device.

Description of the Related Art

Electrical appliances are widely used, and their safety is an important issue. Leakage current detection devices are provided for safety purposes. In conventional leakage current detection devices, a self test is periodically performed to test the detection devices themselves.

However, such periodic self test means that after the leakage current detection device is initially energized, a self test will occur after waiting a self-test period. Faults that threaten users' safety may occur within that wait period.

In addition, conventional leakage current detection devices do not have a discharge circuit. Thus, in low-voltage conditions, i.e. the voltage of the power line is lower than the rated voltage or even lower, the devices can trip accidentally.

Therefore, leakage current detection devices that can perform a self test immediately after energization and can discharge under low voltage conditions are highly desirable.

SUMMARY OF THE INVENTION

Accordingly, the present invention is directed to a leakage current detection device and electrical connection device incorporating the leakage current detection device. The leakage current detection device can perform a self test to test its function immediately after energization, and can avoid accidental tripping under low voltage conditions.

To achieve these and other advantages and in accordance with the purpose of the present invention, in a first aspect, the present invention provides a leakage current detection device which includes: a self-test pulse generating unit, for generating a pulsed triggering signal when the leakage current detection device is initially energized; a self-test unit, for periodically generating simulated leakage current signals, and for generating a simulated leakage current signal based on the pulsed triggering signal; and leakage current detection unit, for detecting the simulated leakage current and actual leakage current faults. In such a device, by using the self-test pulse generating unit, a simulated leakage current can be generated immediately after the device is initially energized, which prevents faults and unsafe conditions within the first period before periodic self test starts.

In one embodiment of the present invention, the self-test unit includes: a reference voltage generating sub-unit, for generating a reference voltage; a periodic voltage generating sub-unit, for generating a periodically varying voltage, which is below the reference voltage during some parts of each period and above the reference voltage during other parts of each period; a comparator, for comparing the reference voltage and the periodically varying voltage; and a first switching element, for generating a simulated leakage current signal based on a comparison result output by the comparator. This way, the self-test unit can periodically generates simulated leakage current signals.

In one embodiment, the pulsed triggering signal is a triggering voltage, and the self-test pulse generating unit includes: a second switching element, which becomes conductive when the leakage current detection device is initially energized, to generate the triggering voltage; and a second capacitor, for causing the second switching element to become non-conductive after a predetermined charging period; wherein the comparator further compares the reference voltage and the triggering voltage when the second switching element is conductive. This way, the charging time period can be adjusted by adjusting the value of the second capacitor.

In one embodiment, the pulsed triggering signal is a triggering voltage, and the self-test pulse generating unit includes: a second switching element, which becomes conductive when the leakage current detection device is initially energized, to generate the triggering voltage; and a differential circuit, for causing the second switching element to become non-conductive after a predetermined differential period; wherein the comparator further compares the reference voltage and the triggering voltage when the second switching element is conductive. This way, the charging time period can be adjusted by adjusting the value of the differential circuit.

In one embodiment, the pulsed triggering signal functions to pull down the reference voltage, and the self-test pulse generating unit includes: a second switching element, which becomes conductive when the leakage current detection device is initially energized, to pull down the reference voltage; and a differential circuit, for causing the second switching element to become non-conductive after a predetermined time period.

In one embodiment, the periodic voltage generating sub-unit includes a first resistor and a first capacitor connected in series.

In one embodiment, the period of the simulated leakage current signals periodically generated by the periodic voltage generating sub-unit is adjusted by changing values of the first capacitor and the first resistor.

In one embodiment, the second switching element is a transistor, a diode, or a silicon-controlled rectifier.

In one embodiment, the leakage current detection device further includes a discharge unit, for preventing the self-test unit from generating the simulated leakage current when a voltage of a power line connected to the leakage current detection device is below a predetermine voltage. This way, the discharge unit prevents the self-test unit from operating when the voltage is low.

In one embodiment, the discharge unit includes a third transistor which couples an output terminal of the periodic voltage generating sub-unit to a ground to cause the periodically varying voltage to be zero when the voltage of a power line connected to the leakage current detection device is below the predetermine voltage.

In one embodiment, the leakage current detection unit further includes a first fault indicator unit for indicating the leakage current faults. This way, the user can be informed of a leakage current fault in the power circuit.

In one embodiment, the self-test unit further includes a second fault indicator unit for indicating abnormal conditions of the leakage current detection device. This way, the user can be informed of an abnormal conditions in the leakage current detection device itself.

In another aspect, the present invention provides an electrical connection device which employs a leakage current detection device described above.

In summary, by providing the self-test pulse generating unit, the self-test unit can be triggered immediately after the device is initially energized to perform a self test, which prevents faults and unsafe conditions before periodic self test starts. By providing a discharge unit, the leakage current detection device is prevented form performing self test under low voltage conditions and accidental tripping can be avoided.

BRIEF DESCRIPTION OF THE DRAWINGS

Embodiments of the invention are described with reference to the following drawings.

DETAILED DESCRIPTION OF THE PREFERRED EMBODIMENTS

Embodiments of the present invention are described with reference to the drawings. It will be apparent to those skilled in the art that various modification and variations can be made in the leakage current detection devices of the present invention without departing from the spirit or scope of the invention. Thus, it is intended that the present invention cover modifications and variations that come within the scope of the appended claims and their equivalents.

Figure 1:
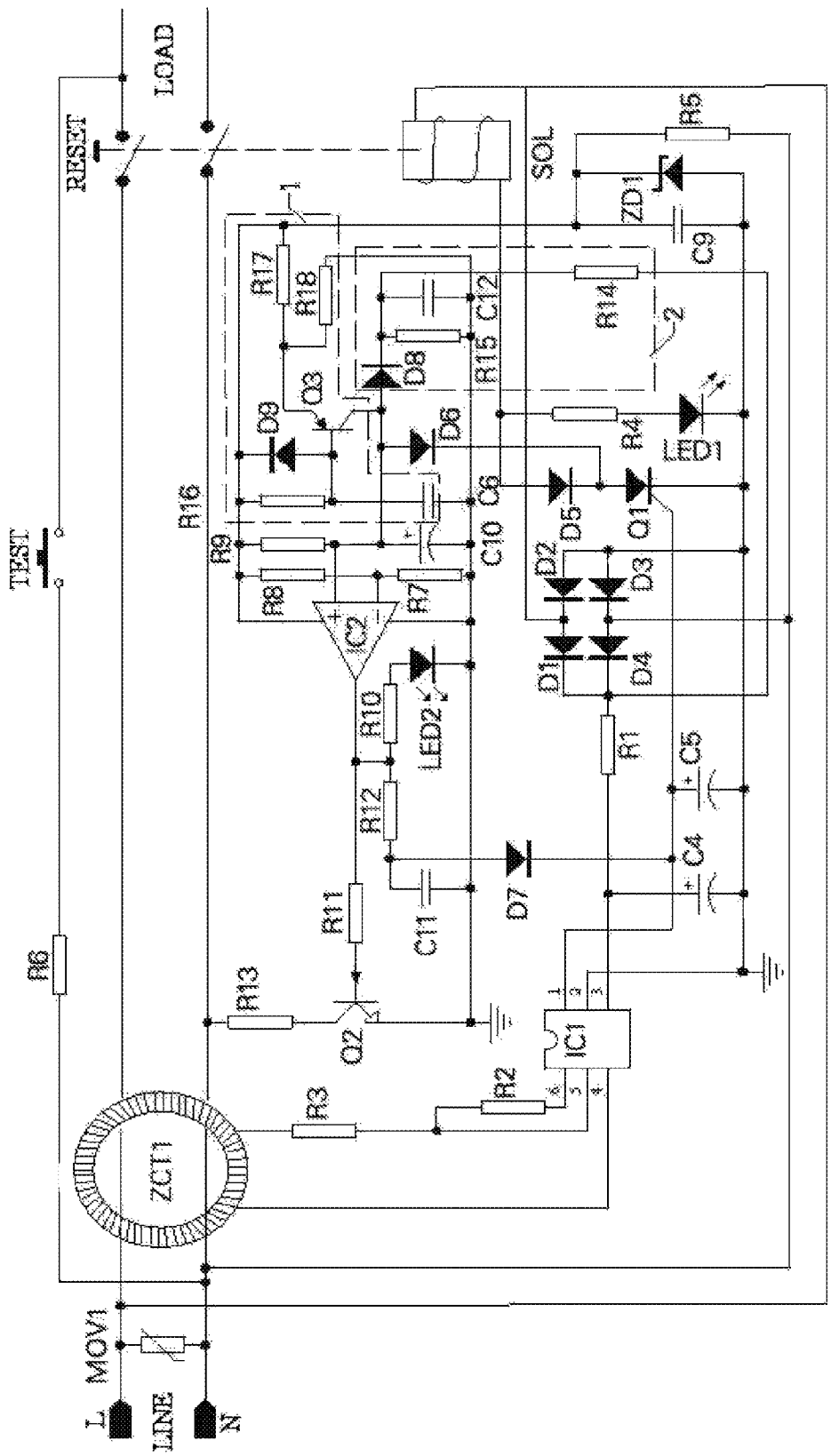
FIG. 1 is a circuit diagram of a leakage current detection device according to a first embodiment of the present invention.

FIG. 1 is a circuit diagram of a leakage current detection device according to a first embodiment of the present invention.

As shown in FIG. 1, the leakage current detection device includes: (1) self-test pulse generating unit 1, for generating a pulsed triggering signal when the leakage current detection device is initially energized; (2) self-test unit, for periodically generating simulated leakage current signals, and generating a simulated leakage current signal based on the pulsed triggering signal; and (3) leakage current detection unit, for detecting the simulated leakage current and actual leakage current faults, The leakage current detection unit includes: detection coil ZCT1, solenoid SOL, silicon-controlled rectifier Q1, diode D5, and processor IC1, etc. The silicon-controlled rectifier Q1 may be replaced by other elements with a switching function, such as a MOS transistor.

The self-test unit includes: reference voltage generating sub-unit, periodic voltage generating sub-unit, comparator IC2, and first transistor Q2. The reference voltage generating sub-unit generates a reference voltage. The periodic voltage generating sub-unit generates a periodically varying voltage, which is below the reference voltage during some parts of each period and above the reference voltage during other parts of each period. The comparator compares the reference voltage and the periodically varying voltage. The first transistor generates a simulated leakage current signal based on the result of the comparator. In FIG. 1, the reference voltage generating sub-unit includes a voltage divider circuit formed by resistors R7 and R8. The periodic voltage generating sub-unit includes resistor R9 and capacitor C10. The simulated leakage current signal is a leakage current on the neutral line N which is greater than a threshold current value.

The self-test pulse generating unit 1 includes second transistor Q3, capacitor C6, diode D9, and resistors R16, R17 and R18 connected as shown. It should be understood that the second transistor Q3 may alternatively be other elements with a switching or selection function, such as diode, amplifier, comparator circuit, etc.

The two ends of the detector coil ZCT1 are coupled to pins 4 and 5 of the process IC1. When the output voltage change of the coil ZCT1 is greater than a threshold value, the pin 1 of IC1 outputs a high voltage level; otherwise, it outputs a low voltage level. The rectifier bridge D1-D4 is respectively coupled to the hot line L and neutral line N, and is coupled to the pin 3 of IC1 via resistor R1, to supply a working voltage to the IC1 during both the positive and the negative half cycles of the AC power.

When the reset switch RESET is reset, the power lines L and N are energized, and the alternating current signal between the L and N lines is a sine wave.

The operations of the leakage current detection unit, the self-test unit and the self-test pulse generating unit 1 are described below.

(1) Detecting Leakage Current

When the reset switch RESET is closed, the coil ZCT1 detects whether a leakage current is present on the hot and neutral lines L, N.

If no leakage current is present, the pin 1 of IC1 outputs a low voltage level, so the silicon-controlled rectifier Q1 is non-conductive; as a result, the current flowing in the solenoid SOL does not change, so the reset switch RESET will not be opened.

If a leakage current is present, the coil ZCT1 outputs an induced voltage to the pins 4 and 5 of IC1, so the pin 1 of IC1 outputs a high voltage level, which causes the silicon-controlled rectifier Q1 to become conductive. At this time, the current in the solenoid SOL changes by a relatively large amount due to the silicon-controlled rectifier Q1 becoming conductive, so the reset switch RESET becomes open. This disconnects the current path from the hot line L to the neutral line N.

When the electrical path is in the connected state, i.e. the current in the solenoid did not change by a large amount due to the conduction of the silicon-controlled rectifier Q1, a first fault indicator unit (including resistor R4 and light emitting diode LED1) which is coupled to the solenoid will continue to emit an indicator signal, to inform the user that the reset switch RESET is closed. When the silicon-controlled rectifier Q1 becomes conductive, the reset switch RESET will become open, and the first fault indicator unit will no longer emit the indicator signal, which informs the user that the power supply path is now open. In addition, when the solenoid SOL is broken, e.g. the coil of the solenoid SOL is an open circuit, the first fault indicator unit will also cease to emit the indicator signal.

For the self-test unit, because the N line is not supplying power to the self-test unit under this condition, this unit does not function.

(2) Self Testing

Similarly, when the reset switch RESET is closed, the coil ZCT1 detects whether a leakage current is present on the L and N lines.

The self-test unit includes a periodic voltage generating sub-unit, which includes serially connected first resistor R9 and first capacitor C10. The periodic voltage generating sub-unit is also coupled to the silicon-controlled rectifier Q1 and the first (positive) input terminal of the comparator IC2. When the silicon-controlled rectifier Q1 is conductive, it provides a discharge path for the charges on the first capacitor C10, thereby lowering the voltage on the first capacitor C10.

The positive input of the comparator is coupled between the first resistor R9 and first capacitor C10, to receive the voltage signal on the capacitor C10. The negative input of the comparator is coupled to the reference voltage generating sub-unit formed by resistors R7 and R8, to receive the reference voltage signal. Thus, both the periodic voltage generating sub-unit and the reference voltage generating sub-unit receive the voltage signal from the N line.

Situation 1: The Leakage Current Detection Unit Functions Normally:

Because the first resistor R9 and first capacitor C10 on the positive input terminal of IC2 are coupled to the N line via resistor R5, the resistor R9 coupled to the positive input terminal of IC2 charges the capacitor C10. When the voltage on C10 is higher than the voltage on R7 (i.e. the negative input terminal of IC2), the output of IC2 will flip, and IC2 outputs s high voltage.

The output terminal of IC2 is coupled to the base of first transistor Q2 via resistor R11; thus, once IC2 outputs a high voltage at its output terminal, Q2 becomes conductive, which in turn pulls down the voltage between resistor R13 and transistor Q2. The time period when transistor Q2 is conductive is dependent on the time period when the output of comparator IC2 is maintained at the high voltage. The conduction of transistor Q2 introduces a predetermined current Ic to the coil ZCT1. Obviously, the current Ic should be greater than or equal to the leakage current detection threshold current $I_f$, otherwise the processor IC1 will not be able to recognize the output signal of coil ZCT1 corresponding to current Ic as an effective leakage current signal. The leakage current for detection by coil ZCT1 is introduced via first transistor Q2 and resistor R13, and flows from the emitter of transistor Q2 via diode D2 of the rectifier bridge to the hot line L, completing a current loop.

When current Ic is present, based on the output signal of coil ZCT1, the processor IC1 outputs a high voltage signal on its pin 1, which causes the silicon-controlled rectifier Q1 to be conductive. At this time, the silicon-controlled rectifier Q1 is conductive, and therefore diode D6 is also conductive; because diode D6 is coupled to capacitor C10 and the positive input terminal of comparator IC2, capacitor C10 will discharge via diode D6 and silicon-controlled rectifier Q1, rapidly bringing down the voltage on the positive input terminal of IC2, causing the output of IC2 to flip to the low voltage.

When the voltage on the positive input of IC2 is lower than that on the negative input, IC2 outputs a low voltage at the output terminal, causing the first transistor Q2 to become non-conductive. At this time, because the current supply to coil ZCT1 is stopped (i.e. current Ic is not generated), the coil ZCT1 does not detect a leakage current, and so the pin 1 of IC1 and the control electrode of the silicon-controlled rectifier Q1 have a zero voltage. Thus, it can be seen that when the leakage current detection unit functions normally, the conductive state of the silicon-controlled rectifier Q1 is dependent on the voltage of capacitor C10. Because the charge on capacitor C10 is discharged, its voltage drops, so that it cannot reach the threshold voltage for making the silicon-controlled rectifier Q1 and/or diode D6 conductive, and therefore the silicon-controlled rectifier Q1 becomes non-conductive.

When the leakage current detection unit functions normally and the predetermined current value $I_f$ did not change, the above process is repeated, and capacitor C10 is charged continually. The length of the detection period (i.e. the period of the periodically varying voltage) can be adjusted by changing the values of capacitor C10 and resistor R9. The detection period may be an integer times the period of the alternating current.

Situation 2: The Leakage Current Detection Unit Functions Abnormally:

When the leakage current detection unit functions abnormally or the predetermined current value $I_f$ increases, such as: when the capacitor is open, when the processor IC1 is defective causing the leakage current detection unit to lose its leakage current protection function, or when the predetermined current value $I_f$ increases such that the leakage current Ic generated by the self-test unit is less than $I_f$, then, process IC1 outputs a low voltage at its pin 1, so that silicon-controlled rectifier Q1 is non-conductive. At this time, capacitor C10 does not have a discharge path, resulting in the voltage on capacitor C10 to be continuously higher than that of the negative input of comparator IC2. Thus, comparator continuously outputs a high voltage at its output, causing transistor Q2 to be continuously conductive, and the indicator LED2 (second fault indicator unit) is continuously lit which indicates to the user that the leakage current detection device should not be used any more.

If, at this time, silicon-controlled rectifier Q1, diodes D6 and D7 all function normally, then comparator IC2 will charge capacitor C11 via resistor R12. When this voltage reaches a predetermined value, diode D7 becomes conductive, causing silicon-controlled rectifier Q1 becomes conductive. Because comparator IC2 will continuously output a high voltage level, the conduction of silicon-controlled rectifier Q1 causes the current in the solenoid SOL to immediately increase, which opens the reset switch RESET, thereby disconnecting the electrical connection between the LINE side and LOAD side. This prevents the user from using the appliance.

(3) Self Testing when the Device is Initially Energized

As described above, the self-test unit can perform periodic self testing of the device. However, if the self-test period is set to be too long, then after the device is initially energized, there will be a long time period when the device is not self tested. Thus, self-test pulse generating unit 1 operates to cause immediate self testing after the device is initially energized.

Here initially energized referred to, for example, when the device is first connected to the line power, or when it is disconnected and then reconnected to the line power.

When the leakage current detection device is initially energized, the second transistor Q3 becomes conductive, and resistor R17 charges capacitor C10 via the second transistor Q3. When the charged voltage reaches the standard predetermined voltage of comparator IC2, comparator IC2 outputs a self-test pulse which causes transistor Q2 to be conductive. The conduction of Q2 generates a simulated leakage current for detector coil ZCT1. As a result, processor IC1 outputs a drive signal, which drives the silicon-controlled rectifier Q1 to be conductive, and diode D6 also becomes conductive. The conduction of diode D6 causes the charge on capacitor C10 to be immediately discharged, comparator IC2 no longer keeps Q2 conductive, thereby completing the first self test. In this process, capacitor C6 is also charged via resistor R16, so that the base voltage of the second transistor Q3 increases, causing it to become non-conductive. If the device functions normally, then the self-test pulse generating unit 1 will no longer operate. Thereafter, self testing is effectuated by resistor R9 and capacitor C10 as described earlier.

Preferably, the leakage current detection device further includes: (4) discharge unit, which functions to prevent the self-test unit from generating a simulated leakage current when the voltage of the power line is below a predetermine voltage level. As shown in FIG. 1, the discharge unit includes diode D8, capacitor C12, and resistors R14 and R15.

When a large load is connected on the LOAD side to consume power, the voltage of the power line may drop due to the large current generated by the load, or, when the supply power is turned off causing the voltage to decrease linearly, the voltage across the two ends of the diode D8 will change; if the voltage at the anode of diode D8 is below a predetermined voltage, then diode D8 becomes conductive, so the voltage on capacitor C10 will immediately drop, which prevents the comparator IC2 from generating a self-test signal. When the device functions normally, the voltage on the anode of diode D8 is higher than that at the capacitor C10, so that diode D8 does not conduct.

Figure 2:
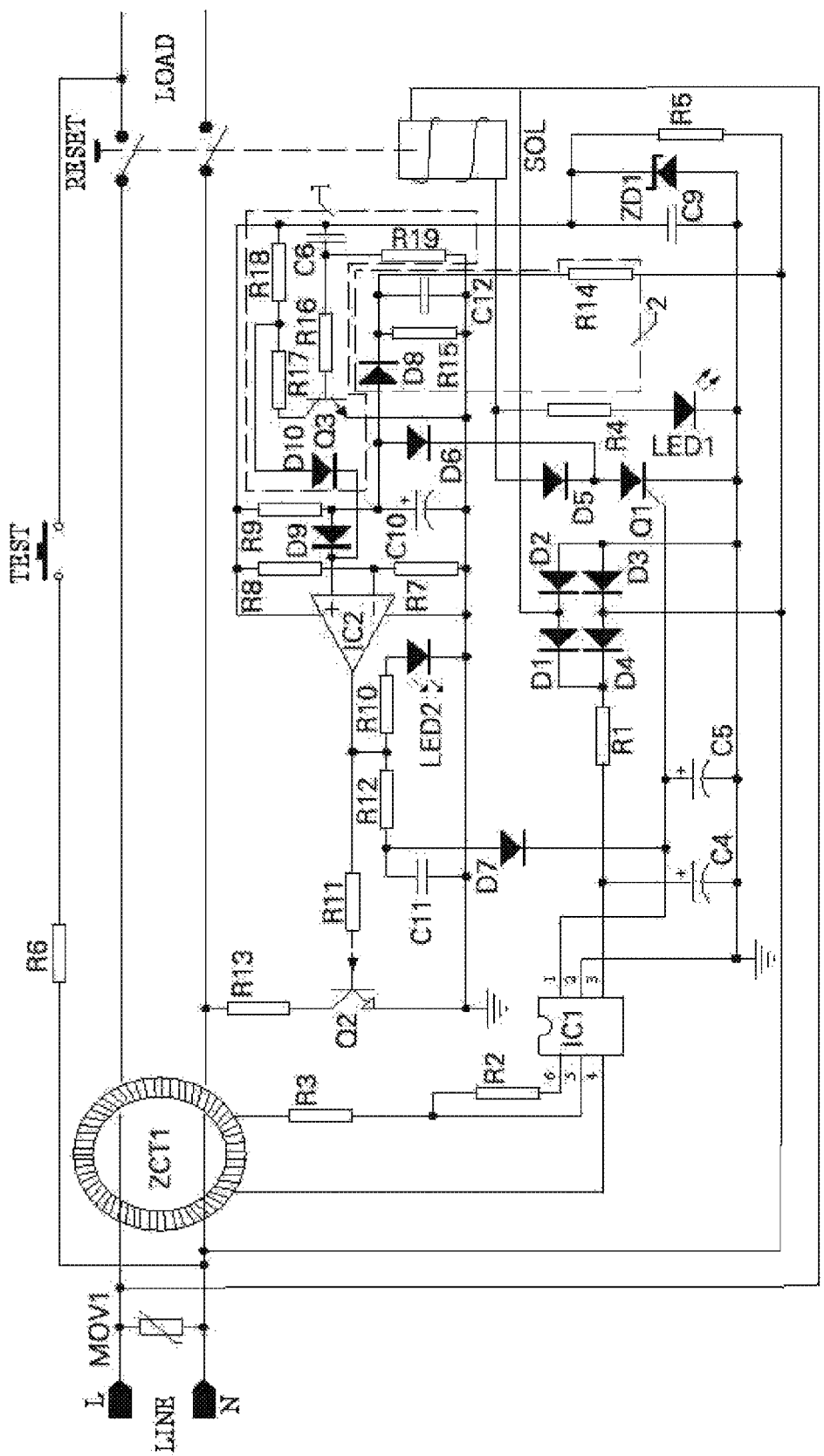
FIG. 2 is a circuit diagram of a leakage current detection device according to a second embodiment of the present invention.

FIG. 2 is a circuit diagram of a leakage current detection device according to a second embodiment of the present invention. One difference between the circuits of FIG. 2 and FIG. 1 is that a differential circuit formed by capacitor C6 and resistor R19 is used to open the second transistor Q3.

More specifically, the self-test pulse generating unit 1 includes the second transistor Q3, the differential circuit formed by capacitor C6 and resistor R19, diode D10, and resistors R16, R17 and R18. When the device is initially energized, the differential circuit capacitor C6 and resistor R19 generates a differential voltage to make transistor Q3 conductive. The voltage provided by diode D10 to comparator IC2 exceeds the standard predetermined value, so IC2 outputs a self-testing pulse, causing transistor Q2 to be conductive. The conduction of transistor Q2 provides a simulated leakage current to the coil ZCT1. As a result, processor IC1 outputs a drive signal for the silicon-controlled rectifier Q1, thereby completing one self test. After capacitor C6 and resistor R19 generate the differential voltage, Q3 becomes non-conductive. If the device functions normally, then the self-test pulse generating unit 1 will no longer operate. Thereafter, self testing is effectuated by resistor R9 and capacitor C10 as described earlier.

Figure 3:
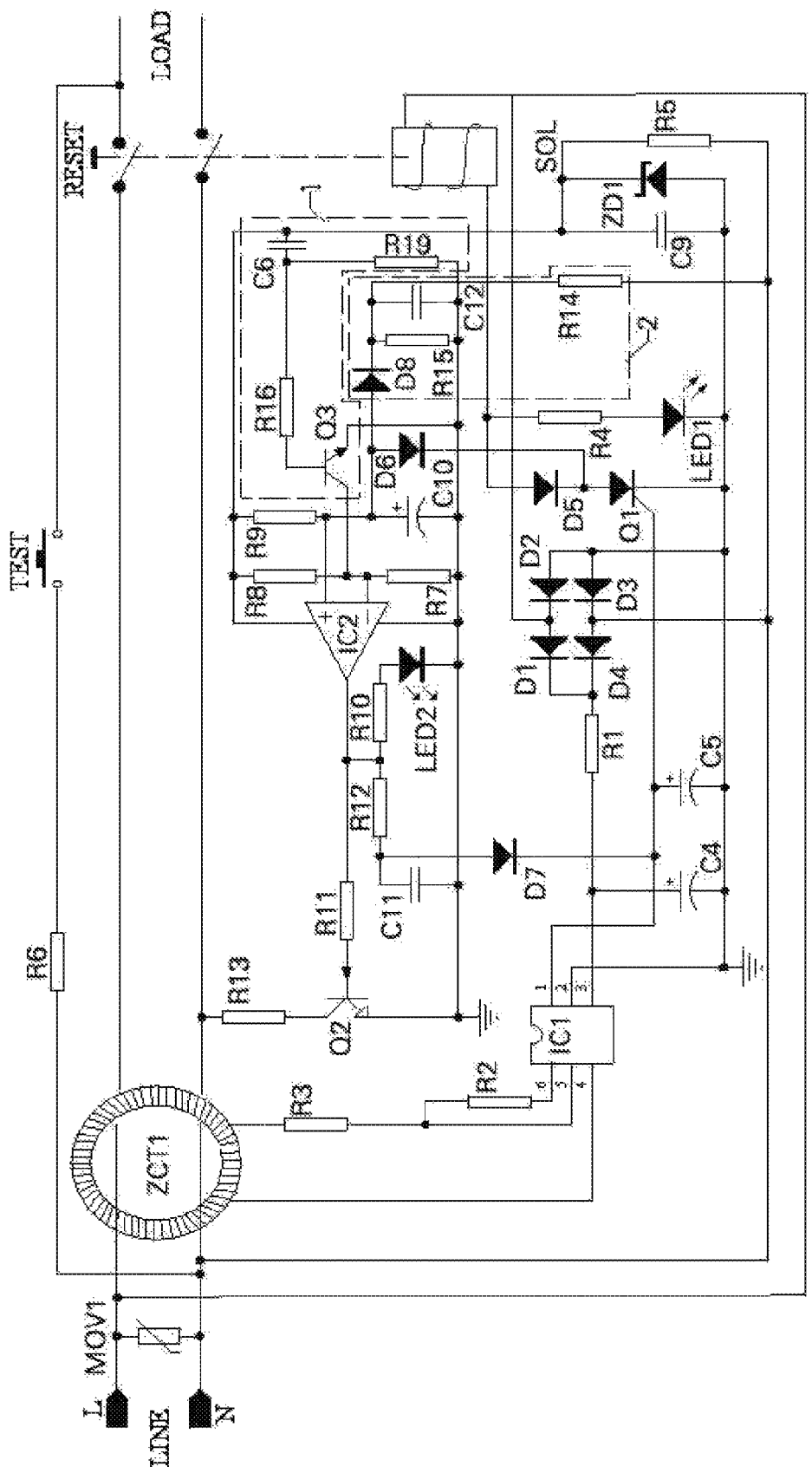
FIG. 3 is a circuit diagram of a leakage current detection device according to a third embodiment of the present invention.

FIG. 3 is a circuit diagram of a leakage current detection device according to a third embodiment of the present invention. One difference between the circuits of FIG. 3 and FIG. 2 is that the conduction of the second transistor Q3 functions to pull down the voltage at the second (negative) input terminal of the comparator IC2.

More specifically, the self-test pulse generating unit 1 includes the second transistor Q3, the differential circuit formed by capacitor C6 and resistor R19, and resistor R16. When the device is initially energized, the differential circuit capacitor C6 and resistor R19 generates a voltage to make transistor Q3 conductive. This pulls down the voltage at the negative input terminal of comparator IC2, so IC2 outputs a self-testing pulse, causing transistor Q2 to be conductive. The conduction of transistor Q2 provides a simulated leakage current to the coil ZCT1; as a result, processor IC1 outputs a drive signal for the silicon-controlled rectifier Q1, thereby completing one self test. After capacitor C6 and resistor R19 generate the differential voltage, Q3 becomes non-conductive. If the device functions normally, then the self-test pulse generating unit 1 will no longer operate. Thereafter, self testing is effectuated by resistor R9 and capacitor C10 as described earlier.

Figure 4:
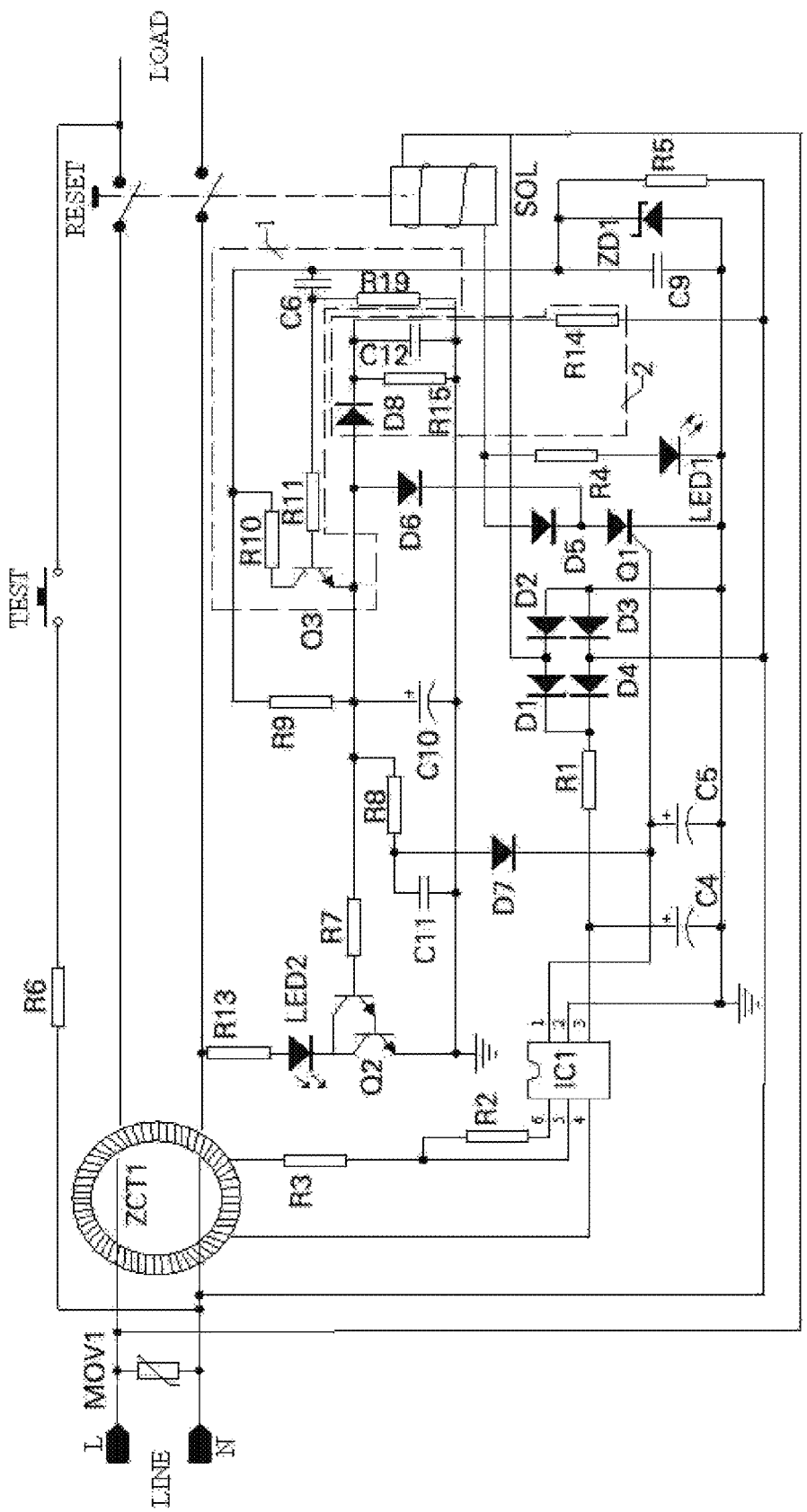
FIG. 4 is a circuit diagram of a leakage current detection device according to a fourth embodiment of the present invention.

FIG. 4 is a circuit diagram of a leakage current detection device according to a fourth embodiment of the present invention.

As shown in FIG. 4, the self-test pulse generating unit 1 includes the second transistor Q3, a differential circuit formed by capacitor C6 and resistor R19, and resistors R10 and R11. When the device is initially energized, the differential circuit capacitor C6 and resistor R19 generates a voltage to make transistor Q3 conductive. The conduction of Q3 causes the first transistor Q2 to be conductive. The conduction of transistor Q2 provides a simulated leakage current to the coil ZCT1; as a result, processor IC1 outputs a drive signal for the silicon-controlled rectifier Q1, thereby completing one self test. After capacitor C6 and resistor R19 generate the differential voltage, Q3 becomes non-conductive. If the device functions normally, then the self-test pulse generating unit 1 will no longer operate. Thereafter, self testing is effectuated by resistor R9 and capacitor C10 as described earlier.

It will be apparent to those skilled in the art that various modification and variations can be made in the leakage current detection circuit of the present invention without departing from the spirit or scope of the invention. Thus, it is intended that the present invention cover modifications and variations that come within the scope of the appended claims and their equivalents.

What is claimed is:

1. A leakage current detection device comprising:
    a self-test pulse generating unit, for generating a pulsed triggering signal when the leakage current detection device is initially energized;
    a self-test unit, for periodically generating simulated leakage current signals, and for generating a simulated leakage current signal based on the pulsed triggering signal; and
    leakage current detection unit, for detecting the simulated leakage current and actual leakage current faults,
    wherein the self-test unit includes:
    a reference voltage generating sub-unit, for generating a reference voltage;
    a periodic voltage generating sub-unit, for generating a periodically varying voltage, which is below the reference voltage during some parts of each period and above the reference voltage during other parts of each period;
    a comparator, for comparing the reference voltage and the periodically varying voltage; and
    a first switching element, for generating a simulated leakage current signal based on a comparison result output by the comparator.

2. The leakage current detection device of claim 1, wherein the pulsed triggering signal is a triggering voltage, and wherein the self-test pulse generating unit includes:
    a second switching element, which becomes conductive when the leakage current detection device is initially energized, to generate the triggering voltage; and
    a second capacitor, for causing the second switching element to become non-conductive after a predetermined charging period;
    wherein the comparator further compares the reference voltage and the triggering voltage when the second switching element is conductive.

3. The leakage current detection device of claim 1, wherein the pulsed triggering signal is a triggering voltage, and wherein the self-test pulse generating unit includes:

a second switching element, which becomes conductive when the leakage current detection device is initially energized, to generate the triggering voltage; and a differential circuit, for causing the second switching element to become non-conductive after a predetermined differential period;

wherein the comparator further compares the reference voltage and the triggering voltage when the second switching element is conductive.

4. The leakage current detection device of claim 1, wherein the pulsed triggering signal functions to pull down the reference voltage, and wherein the self-test pulse generating unit includes:

a second switching element, which becomes conductive when the leakage current detection device is initially energized, to pull down the reference voltage; and a differential circuit, for causing the second switching element to become non-conductive after a predetermined time period.

5. The leakage current detection device of claim 1, wherein the periodic voltage generating sub-unit includes a first resistor and a first capacitor connected in series.

6. The leakage current detection device of claim 5, wherein a period of the simulated leakage current signals periodically generated by the periodic voltage generating sub-unit is adjusted by changing values of the first capacitor and the first resistor.

7. The leakage current detection device of claim 2, wherein the second switching element is a transistor, a diode, or a silicon-controlled rectifier.

8. The leakage current detection device of claim 3, wherein the second switching element is a transistor, a diode, or a silicon-controlled rectifier.

9. The leakage current detection device of claim 4, wherein the second switching element is a transistor, a diode, or a silicon-controlled rectifier.

10. The leakage current detection device of claim 1, further comprising:

a discharge unit, for preventing the self-test unit from generating the simulated leakage current when a voltage of a power line connected to the leakage current detection device is below a predetermine voltage.

11. The leakage current detection device of claim 10, wherein the discharge unit includes a diode which couples an output terminal of the periodic voltage generating sub-unit to a ground to cause the periodically varying voltage to be zero when the voltage of the power line connected to the leakage current detection device is below the predetermine voltage.

12. The leakage current detection device of claim 10, wherein the leakage current detection unit further includes a first fault indicator unit for indicating the leakage current faults.

13. The leakage current detection device of claim 10, wherein the self-test unit further includes a second fault indicator unit for indicating abnormal conditions of the leakage current detection device.

14. An electrical connection device comprising the leakage current detection device of claim 1.

* * * * *